United States Patent
Marienborg et al.

(10) Patent No.: US 9,240,801 B2
(45) Date of Patent: Jan. 19, 2016

(54) ANALOG-TO-DIGITAL CONVERTER

(71) Applicant: TEXAS INSTRUMENTS INCORPORATED, Dallas, TX (US)

(72) Inventors: Jan-Tore Marienborg, Oslo (NO); Gregory Arndt, Oslo (NO); Stefan Dannenberger, Langhus (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 14/211,233

(22) Filed: Mar. 14, 2014

(65) Prior Publication Data

US 2015/0263759 A1    Sep. 17, 2015

(51) Int. Cl.
*H03M 3/00* (2006.01)
*H03M 1/00* (2006.01)
*H03M 1/12* (2006.01)

(52) U.S. Cl.
CPC .............. *H03M 3/406* (2013.01); *H03M 3/322* (2013.01); *H03M 3/492* (2013.01); *H03M 3/496* (2013.01); *H03M 1/00* (2013.01); *H03M 1/12* (2013.01); *H03M 3/30* (2013.01)

(58) Field of Classification Search
CPC ............ H03M 3/30; H03M 1/00; H03M 1/12
USPC .......................................... 341/143, 155, 156
See application file for complete search history.

(56) References Cited

U.S. PATENT DOCUMENTS

2008/0048898 A1    2/2008   Miller et al.
2013/0141264 A1*   6/2013   Wan et al. .................... 341/143

OTHER PUBLICATIONS

Prefasi, Enrique et al., "A 0.1 mm2, Wide Bandwidth Continuous-Time ΣΔ ADC Based on a Time Encoding Quantizer in 0.13 μm CMOS," Oct. 2009, IEEE Journal of Solid-State Circuits, vol. 44, No. 10, pp. 2745-2754.

* cited by examiner

*Primary Examiner* — Joseph Lauture
(74) *Attorney, Agent, or Firm* — Ronald O. Neerings; Frank D. Cimino

(57) ABSTRACT

A delta sigma analog-to-digital converter (ADC) providing optimized performance and energy consumption. In one embodiment, a delta-sigma ADC includes a loop filter and a multi-bit quantizer. The multi-bit quantizer is coupled to the loop filter. The quantizer includes a counter, a reference voltage generator, and a comparator. The counter is configured to provide a multi-bit output value that estimates an output of the loop filter. The reference voltage generator is configured to generate a reference voltage ramp based on the output value of the counter. The comparator is coupled to the reference voltage generator to compare the reference voltage ramp to output of the loop filter.

19 Claims, 3 Drawing Sheets

US 9,240,801 B2

ANALOG-TO-DIGITAL CONVERTER

BACKGROUND

Analog-to-digital converters (ADCs) are used in a variety of devices in which it is desirable to convert an analog signal to a digital signal. For example, ADCs may be found in a various communication devices such as radios, cell phones, modems, etc. ADCs may also be found in computer components, such as sound cards, network cards, I/O devices, etc. ADCs may also be used in a variety of other applications.

One type of ADC, the delta-sigma ADC (also called a sigma-delta ADC) is widely used. Delta-sigma ADCs quantize an analog input signal to be converted by displacing the quantization noise to a frequency-band spaced away from the band of the signal, such that the noise can be easily filtered out by a filter operating in the digital domain. This results in improvement of the signal-to-noise (SNR) of the digital signal.

SUMMARY

A delta sigma analog-to-digital converter providing optimized performance and energy consumption are disclosed herein. In one embodiment, a delta-sigma analog-to-digital converter (ADC) includes a loop filter and a multi-bit quantizer. The multi-bit quantizer is coupled to the loop filter. The quantizer includes a counter, a reference voltage generator, and a comparator. The counter is configured to provide a multi-bit output value that estimates an output of the loop filter. The reference voltage generator is configured to generate a reference voltage ramp based on the output value of the counter. The comparator is coupled to the reference voltage generator to compare the reference voltage ramp to output of the loop filter.

In another embodiment, a delta-sigma ADC includes a multi-bit quantizer and a loop filter. The loop filter is coupled to the quantizer, and is configured to provide a signal to be quantized to the quantizer. The loop filter includes a first integrator, a second integrator and a sample and hold circuit. The second integrator is coupled to an output of the first integrator and is configured to integrate output signal generated by the first integrator. The sample and hold circuit is coupled between the first integrator and the second integrator. The sample and hold circuit is configured to sample the output signal generated by the first integrator at an output sample rate of the quantizer.

In a further embodiment, a delta-sigma ADC includes a loop filter, a multi-bit quantizer, and a pulse width modulated (PWM) digital-to-analog converter (DAC). The loop filter includes a first integrator, a second integrator, and a sample and hold circuit. The second integrator is coupled to an output of the first integrator and is configured to integrate output signal generated by the first integrator. The sample and hold circuit is coupled between the first integrator and the second integrator. The multi-bit quantizer is coupled to the loop filter. The quantizer includes a counter, a reference voltage generator, and a comparator. The counter is configured to provide a multi-bit output value that estimates an output of the loop filter. The reference voltage generator is configured to generate a reference voltage ramp based on the output value of the counter. The comparator is coupled to the reference voltage generator to compare the reference voltage ramp to output of the loop filter. The PWM DAC is configured to generate a PWM signal based on an output of the quantizer. The PWM signal is provided to a summing node that generates a difference of the PWM signal and an analog signal that is to be digitized by the ADC.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
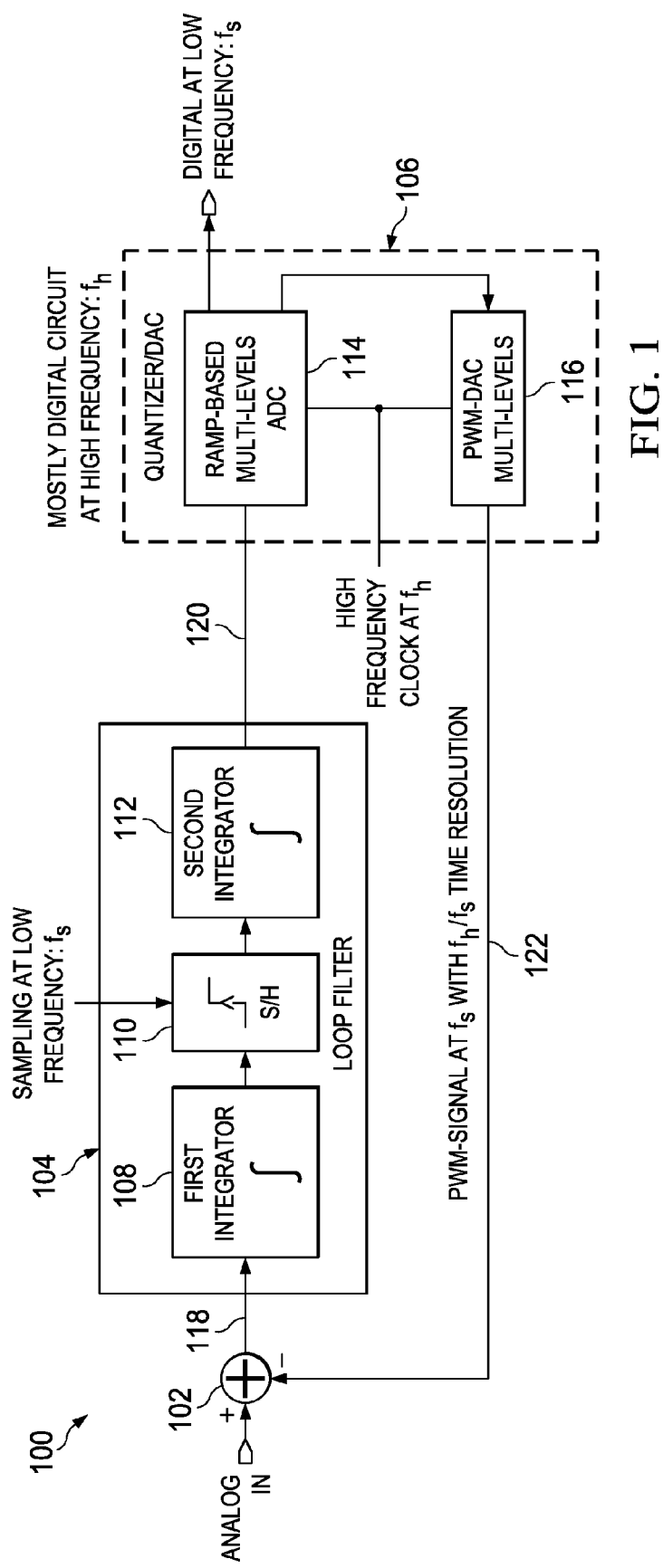
FIG. 1 shows a block diagram of a delta-sigma analog-to-digital converter (ADC) in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of additional factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Radio frequency (RF) receivers may apply sigma-delta analog-to-digital converters (ADCs) to digitize baseband signals. Sigma-delta ADCs suitable for RF applications are preferably configurable to support a variety of radio standards and to allow variation of bandwidth versus dynamic range/power consumption.

Conventional delta-sigma ADCs may provide performance improvements by increasing sampling frequency and/or increasing the number of levels of digital feedback provided. Unfortunately, increased sampling frequency put more stringent demands on the digital filter while more levels of the digital feedback significantly complicates the analog design and typically also significantly increase the power consumption. Neither of these solutions provides reconfigurability. Multilevel digital feedback can greatly increase design complexity of the digital-to-analog converter (DAC) that provides feedback in the sigma-delta ADC, requiring, in some cases, use of digital circuitry to compensate for analog circuit imperfections. The multilevel quantizer (i.e., FLASH ADC) employed in conventional multilevel feedback schemes employs multiple parallel comparators, which increases cost and energy consumption of the ADC.

Increasing the sampling frequency of the sigma-delta ADC presents additional issues. Increasing the sampling frequency of the sigma-delta ADC requires increased signal processing in the digital domain as the decimation filter following the ADC must work at a higher frequency. The analog components of the ADC must also operate at higher frequencies. Energy consumption in the ADC tends to increase with sampling frequency, and the maximum achievable sampling frequency is constrained by component limitations.

Embodiments of the delta-sigma ADC disclosed herein provide high efficiency while allowing run-time selection of bandwidth versus dynamic range. Embodiments are well suited for low power RF receiver applications and other applications that can benefit from a flexible low power ADC architecture. Embodiments include a pulse width modulated (PWM) feedback DAC and multi-bit quantizer that share components to reduce cost and energy consumption.

The pulses provided by the PWM feedback DAC may introduce harmonic distortion in the loop filter. To mitigate the effects of PWM induced harmonic distortion, a sample and hold circuitry is included in the loop filter of the ADC. The sample and hold circuit removes harmonic distortion caused by the PWM DAC output.

FIG. 1 shows a block diagram of a delta-sigma ADC 100 in accordance with various embodiments. The ADC 100 includes differencing circuitry 102, a loop filter 104, and quantizer/DAC 106. The differencing circuitry 102 determines the difference of the analog signal input to the ADC 100 for digitization and the feedback signal generated by the quantizer/DAC 106, and provides as output a difference signal 118 representing the difference of the analog signal input and the feedback signal. The differencing circuitry 102 may include amplifiers, resistors, capacitors, and other components.

The loop filter 104 is coupled to, and receives difference signal 118 from, the differencing circuitry 102. The loop filter 104 integrates the difference signal 118 output by the differencing circuitry 102 over time to produce a filter output signal 120 that is provided to the quantizer/DAC 106. The loop filter 104 includes a plurality of integrators. A first of the integrators 108 may be a continuous time integrator. A sample and hold circuit 110 is coupled to an output of the first integrator. Output of the sample and hold circuit 110 is provided to the second integrator 112. The second integrator 112 generates the loop filter output signal 120 that is input to the quantizer/DAC 106. Some embodiments of the loop filter 104 may include more than two integrators or different combinations of feedback and feed forward topologies. The integrators 108, 112 may include amplifiers, capacitors, resistors, etc. arranged to provide integration of input signals.

The quantizer/DAC 106 is coupled to the loop filter 104. The quantizer/DAC 106 includes a multi-level quantizer (i.e., a multi-bit ADC) 114, and a multi-level PWM DAC 116. The PWM DAC 116 produces variable width constant amplitude positive or negative pulses 122. The width of the pulses 122 represents the amplitude of the output signal 120 of the loop filter 104 as quantized by the ADC 114. The pulses 122 are provided to the differencing circuitry 102.

Figure 2:
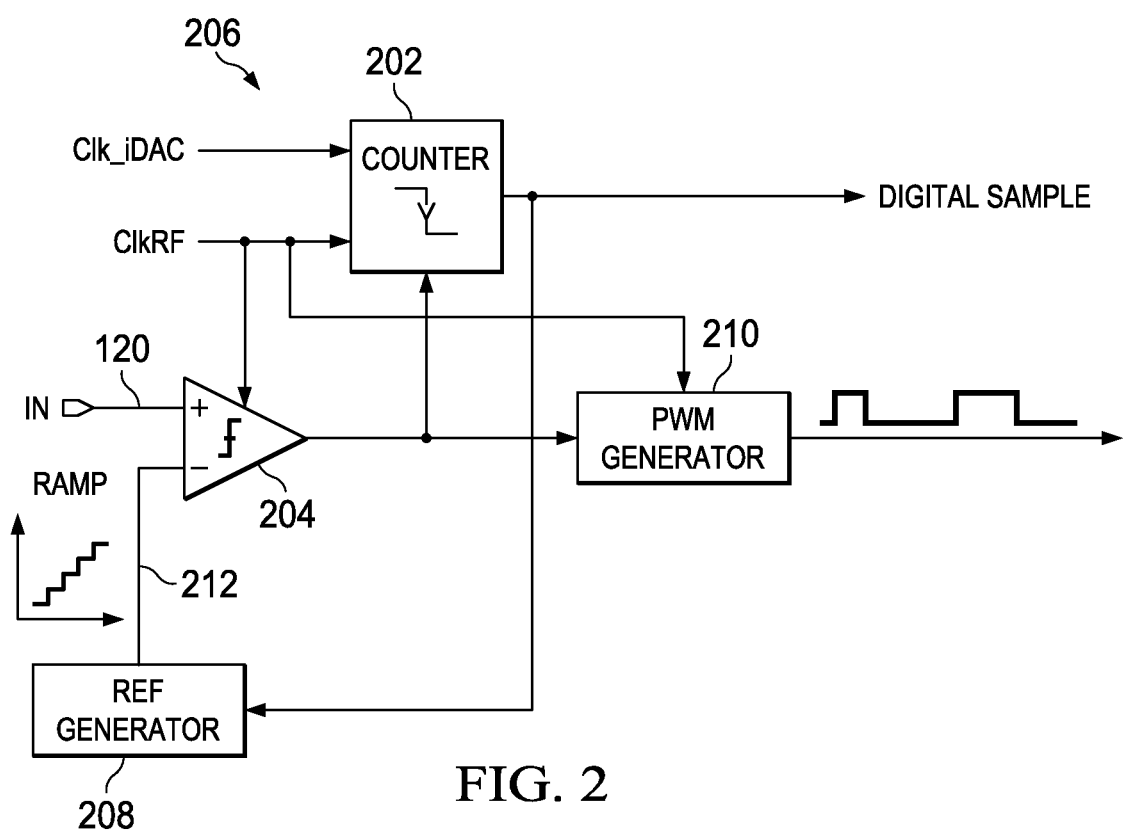
FIG. 2 shows a block diagram of a multi-bit quantizer and pulse width modulator digital-to-analog converter used in a delta-sigma ADC in accordance with various embodiments.

FIG. 2 shows a block diagram of an embodiment of a quantizer/DAC 206 suitable for use as the quantizer/DAC 106 in the delta-sigma ADC 100. The quantizer/DAC 206 includes a multi-bit counter 202, a comparator 204, a reference generator 208, and a PWM generator 210. The output of the counter 202 is the multi-bit digital output sample generated by the ADC 100. Accordingly, the counter 202 includes counting logic to generate at least as many output bits as the number of bits included in the digital output sample of the ADC 100. The counter 202 may be a binary counter. The counter 202 is reset by a signal (ClkiDAC) asserted at the sample rate of the ADC 100 to initiate and control digitization of the loop filter output signal 120. The counter 202 is incremented by a clock signal (ClkRF) having a frequency higher than that of the signal that resets the counter. The clock that increments the counter 202 may have a frequency that is an integer multiple of the signal that resets the counter 202. The digital samples values generated by the counter 202 may be provided to a decimator external to the ADC 100.

The output of the counter 202 is also provided to the reference generator 208. The reference generator 208 generates a ramp signal 212 based on the count value provided by the counter 202. As the counter 202 is incremented, the ramp voltage signal 212 generated by the reference generator 206 also increases. The reference generator 208 may include resistors (e.g., a resistor ladder), amplifiers and other components to generate the ramp voltage signal 212.

The ramp signal 212 generated by the reference generator 206 is provided to the reference input of the comparator 204. The comparator 204 compares the ramp signal 212 to the signal 120 output by the loop filter 104. When the ramp signal 212 voltage equals or exceeds the voltage of the loop filter output signal 120, the output of the comparator 204 changes state and disables the counter 202. The output of the counter 202, when the counter 202 is disabled by the output of the comparator 206, is the value of the digital sample output by the ADC 100. Because a single comparator is used to generate the digital output value, the quantizer/DAC 206 may be substantially less costly and more power efficient that conventional quantizers that employ a FLASH ADC.

The PWM generator 210 generates the DAC output pulses 122 that are provided to the differencing circuitry 102. Each pulse 122 output by the PWM generator 210 may be initiated as soon as the sign of the digital output sample is determined. The PWM generator 210 may resynchronize the output of the comparator 204 with the high speed clock that increments the counter 202. Accordingly, the PWM pulse 122 is provided to the differencing circuitry 102 from the start of the digitization of the loop output signal 120, and the pulse 122 ends when the digitization is complete (i.e., when the comparator changes state).

Thus, the ADC or quantizer 114 comprises the counter 202, the reference generator 208, and the comparator 204. The PWM generator 210 is coupled to, and operates in conjunction with the quantizer, as the PWM DAC 116 generating pulses that vary in width in accordance with the amplitude of the loop filter output signal. Because the DAC steps are formed in the time domain (as PWM pulses 122), no matching of DAC components is necessary. The timing accuracy of the signal clocking the PWM generator 210 is the primary contributor to accuracy of the PWM DAC 116. While the counter 202 and the PWM generator 206 are running faster than the sampling clock, to define the resolution of the DAC feedback, circuitry coupled to the output of the ADC 100 is receiving multi-bit digital samples with values corresponding to the DAC pulse width at the lower sampling frequency. Thus, embodiments of the ADC 100 provide improved resolution without increasing output sample rate or requiring complex quantization and DAC circuitry that would increase cost and energy consumption.

The changing width of the DAC output pulses 122 creates harmonic distortion that is mixed with the ADC quantization noise. Embodiments of the ADC 100 apply the sample and hold circuit 110 to counter the harmonic distortion. The sample and hold circuit 110 samples the output of the first integrator 108 to synchronize the integration of the DAC output pulse and remove the harmonic components. The sampling may be performed at the output sample rate of the ADC 100.

Figure 3:
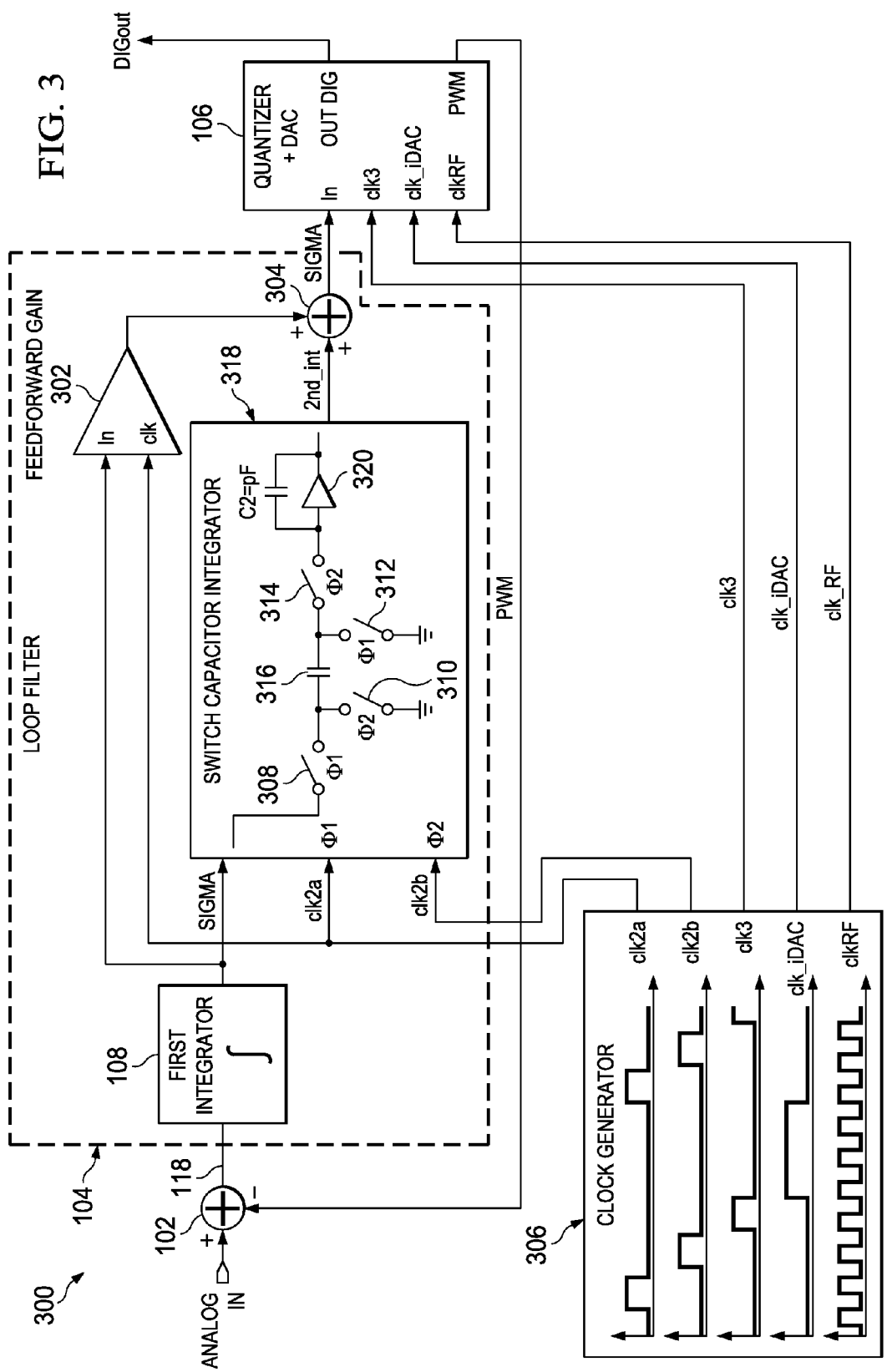
FIG. 3 shows a block diagram of delta-sigma ADC that includes a switched capacitor integrator with sample and hold in accordance with various embodiments.

FIG. 3 shows a block diagram of a delta-sigma ADC 300. The delta-sigma ADC 300 is an embodiment of the delta-sigma ADC 100, and additional detail, relative to ADC 100, is shown in FIG. 3. The ADC 300 includes the differencing circuitry 102, the quantizer/PWM DAC 106, a loop filter 104, and a clock generator 306. The loop filter 104 includes the first integrator 108, and a second integrator 318. Embodiments may also include the feed forward amplifier 302 and summation circuitry 304. The summation circuitry 304 combines the outputs of the first integrator 108 and the second integrator 318.

The first integrator 108 may be a continuous integrator (provides continuous integration of signal 118). The second integrator 318 may be a switched capacitor integrator that combines the functionality of the sample and hold circuit 110 and the second integrator 112 shown in FIG. 1. The integrator 318 includes a sampling capacitor 316 and switches 308-314 that couple the sampling capacitor 316 to the first integrator 108 and the amplifier 320. The switches 308-314 and the capacitor 316 are operated to sample the output of the first integrator 108 and provide the sampled first integrator output voltage to the amplifier 320.

The clock generator 306 generates the clock signals that time the operations of the ADC 300. The high frequency clock signal CLKRF is provided to the quantizer/PWM DAC 106 to increment the counter 202 and clock the PWM generator 206. Other clocks generated by the clock generator 306 may be multiple phases of clock signal that have a period that is a multiple of the period of CLKRF, e.g., multi-phase clocks at the period of the digital sample output interval of the ADC 300. The signal clk_iDAC is a sample period clock that may be applied to the quantizer/PWM DAC 106 to reset the counter 202 and define the maximum width of the output pulse of the PWM DAC 116. As shown in FIG. 3, other sample period clock outputs of the clock generator 306 may be provided to the integrator 318 to control sample and hold timing. The clock generator 306 may include crystal oscillators, phase-locked loops, frequency dividers, etc. arranged to generate the clock signals described herein.

The sigma-delta ADC 300, 100 can trade-off bandwidth for dynamic range by varying the frequency of the sample rate clocks (e.g., clk3, clk_iDAC) with respect to the high frequency clock (CLKRF) that increments the counter 202. For example, dynamic range of the ADC 300 may be increased and bandwidth decreased by increasing the period of the sample rate clocks relative to the CLKRF. Similarly, bandwidth of the ADC 300 may be increased and dynamic range decreased by decreasing the period of the sample rate clocks relative to the CLKRF. Embodiments of the sigma-delta ADC 300, 100 may allow for run-time changes in the sample rate clocks to provide flexibility in the trade-off of bandwidth for dynamic range in various applications.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A delta-sigma analog-to-digital converter (ADC), comprising:
   a loop filter;
   a multi-bit quantizer coupled to the loop filter, the quantizer comprising:
      a counter configured to provide a multi-bit output value that estimates an output of the loop filter to provide a digital output of the ADC;
      a reference voltage generator configured to generate a reference voltage ramp based on the output value of the counter;
      a comparator coupled to the reference voltage generator to compare the reference voltage ramp to output of the loop filter.

2. The ADC of claim 1, wherein an output of the comparator is coupled to the counter to disable counting based on the reference voltage ramp exceeding the output of the loop filter.

3. The ADC of claim 1, further comprising:
   a pulse width modulated (PWM) digital-to-analog converter (DAC); and
   a summing node;
   wherein the PWM DAC is configured to generate a PWM signal based on an output of the quantizer, the PWM signal provided to the summing node;
   wherein the summing node is configured to generate a difference of the PWM signal and an analog signal that is to be digitized by the ADC.

4. The ADC of claim 1, further comprising:
   a first clock source that generates a first clock signal that clocks the counter; and
   a second clock source that generates a second clock signal having a period that is an integer multiple of the first clock signal, the second clock signal defining a sample period of the ADC.

5. The ADC of claim 4, wherein bandwidth and dynamic range of the ADC are adjustable by changing frequency of the second clock signal relative to frequency of the first clock signal.

6. The ADC of claim 1, wherein the loop filter comprises:
   a first integrator;
   a second integrator coupled to an output of the first integrator and configured to integrate output signal generated by the first integrator; and
   a sample and hold circuit coupled between the first integrator and the second integrator.

7. The ADC of claim 6, wherein the sample and hold circuit is configured to sample the output signal generated by the first integrator at an output sample rate of the quantizer.

8. The ADC of claim 1, wherein the loop filter comprises:
   a continuous time integrator; and
   a switched capacitor integrator coupled to an output of the continuous time integrator, the switched-capacitor integrator configured to sample the output of the continuous time integrator at an output sample rate of the quantizer.

9. The ADC of claim 1, wherein the qualnizer comprises no more than one comparator.

10. A delta-sigma analog-to-digital converter (ADC), comprising:
    a multi-bit quantizer, wherein the quantizer comprises:
       a counter configured to provide a multi bit output value that estimates an output of the loop filter;

a reference voltage generator configured to generate a reference voltage ramp based on the output value of the counter;
a comparator coupled to the reference voltage generator to compare the reference voltage ramp to output of the loop filter; and
a loop filter coupled to the quantizer, the loop filter configured to provide a signal to be quantized to the quantizer the loop filter comprising:
a first integrator;
a second integrator coupled to an output of the first integrator and configured to integrate output signal generated by the first integrator; and
a sample and hold circuit coupled between the first integrator and the second integrator, the sample and hold circuit con red to sample the output signal generated by the first integrator at an output sample rate of the quantizer.

11. The ADC of claim 10, wherein the first integrator is a continuous time integrator, and the second integrator and the sample and hold circuit are embodied in a switched capacitor integrator circuit.

12. The ADC of claim 10, wherein an output of the comparator is coupled to the counter to disable counting based on the reference voltage ramp exceeding the output of the loop filter.

13. The ADC of claim 10, further comprising a pulse width modulated (PWM) digital-to-analog converter (DAC) configured to generated a PWM signal based on an output of the quantizer, the PWM signal provided to a summing node the generates a difference of the PWM signal and an analog signal that is to be digitized by the ADC.

14. The ADC of claim 10, further comprising:
a first clock source that generates a first clock signal that clocks the counter; and
a second clock source that generates a second clock signal having a period that is an integer multiple of the first clock signal, the second clock signal defining a sample period of the ADC.

15. The ADC of claim 14, wherein bandwidth and dynamic range of the ADC are adjustable by changing a ratio of frequency of the second clock signal to frequency of the first clock signal.

16. A delta-sigma analog-to-digital converter (ADC), comprising:
a summing node;
a loop filter comprising:
a first integrator;
a second integrator coupled to an output of the first integrator and configured to integrate output signal generated by the first integrator; and
a sample and hold circuit coupled between the first integrator and the second integrator;
a multi-bit quantizer coupled to the loop filter, the quantizer comprising:
a counter configured to provide a multi-bit output value that estimates an output of the loop filter;
a reference voltage generator configured to generate a reference voltage ramp based on the output value of the counter;
a comparator coupled to the reference voltage generator to compare the reference voltage ramp to output of the loop filter; and
a pulse width modulated (PWM) digital-to-analog converter (DAC) configured to generated a PWM signal based on an output of the quantizer, the PWM signal provided to the summing node, wherein the summing node generates a difference of the PWM signal and an analog signal that is to be digitized by the ADC.

17. The ADC of claim 16, further comprising:
a first clock source that generates a first clock signal that clocks the counter; and
a second clock source that generates a second clock signal having a period that is an integer multiple of the first clock signal, the second clock signal defining a sample period of the ADC;
wherein bandwidth and dynamic range of the ADC are adjustable by changing frequency of the second clock signal relative to frequency of the first clock signal.

18. The ADC of claim 16, wherein the sample and hold circuit is configured to sample the output signal generated by the first integrator at an output sample rate of the quantizer.

19. The ADC of claim 16, wherein an output of the comparator is coupled to the counter to disable counting based on the reference voltage ramp exceeding the output of the loop filter.

* * * * *